United States Patent [19]

Tanaka

[11] Patent Number: 5,436,200
[45] Date of Patent: Jul. 25, 1995

[54] BLANKET TUNGSTEN DEPOSITION

[75] Inventor: Kaoru Tanaka, Kawasaki, Japan

[73] Assignee: Fujitsu Limited, Kawasaki, Japan

[21] Appl. No.: 336,692

[22] Filed: Nov. 7, 1994

[30] Foreign Application Priority Data

Dec. 28, 1993 [JP] Japan .................. 5-338080

[51] Int. Cl.⁶ .......................................... H01L 21/285
[52] U.S. Cl. .................... 437/192; 118/720;
427/124; 427/126.1; 427/255.1; 437/200;
437/246
[58] Field of Search ............... 437/190, 192, 193, 200,
437/245, 246; 118/715, 720; 427/124, 126.1,
250, 253, 255, 255.1

[56] References Cited

U.S. PATENT DOCUMENTS

| | | | |
|---|---|---|---|
| 4,902,645 | 2/1990 | Ohba | 437/200 |
| 5,252,132 | 10/1993 | Oda et al. | 118/725 |
| 5,328,722 | 7/1994 | Ghanayem et al. | 427/250 |
| 5,332,691 | 7/1994 | Kinoshita et al. | 437/192 |

Primary Examiner—T. N. Quach
Attorney, Agent, or Firm—Nikaido, Marmelstein, Murray & Oram

[57] ABSTRACT

A blanket tungsten deposition apparatus comprises a reactor the inside of which is evacuatable, a gas inlet means for introducing a reaction gas into the reactor, mount means for mounting an object substrate to be treated, penetration-preventing means for preventing penetration of gas, disposed to cover a peripheral portion of a surface of the object substrate to be treated and having an inner diameter smaller than a diameter of the object substrate and an outer perimeter larger than that of the object substrate, and another gas inlet means for introducing a gas to a space on the periphery of the object substrate covered by the penetration-preventing means. Growth of W film on a peripheral SiO₂ portion of substrate is prevented and hence production of particles caused by peeling-off of W film is prevented.

3 Claims, 2 Drawing Sheets

BLANKET TUNGSTEN DEPOSITION

BACKGROUND OF THE INVENTION a) Field of the Invention

The present invention relates to a semiconductor device, and more particularly, to technique for forming a blanket tungsten film for inter-layer connection of laminated wiring.

b) Description of the Related Art

Normally, as a plug for connecting wiring layers of multiple layer wiring, tungsten W which is a refractory metal has been employed. However, tungsten has a weak adhesion with $SiO_2$. Thus, For forming a W film on an inter-layer insulating Film formed of $SiO_2$ (including doped oxide), laminated adhesion layer of titanium (Ti) Film/(titanium nitride (TiN) film, TiW film, or WSi Film) is formed first and then W film is formed thereon.

For forming a W film, normally for improving growth rate of tungsten and uniformity of its surface, a substrate is first subjected to flow of silane ($SiH_4$) or dichlorosilane ($SiH_2Cl_2$) For forming a thin film of silicon. Thereafter, gas flows of $SiH_4$ or $SiH_2Cl_2$, and tungsten hexafluoride ($WF_6$) are supplied on the surface thereof for tungsten-silicidizing the thin film of silicon and form a tungsten silicide (WSi) film. Then, gases of hydrogen ($H_2$) and $WF_6$ are allowed to flow over the surface. $WF_6$ is reduced by $H_2$ and a W film is formed on nuclei of WSi.

Here, the method described above has an effect of preventing direct reaction of Ti and $WF_6$ when an adhesion layer is a Laminated layer of Ti/TiN films and a W film is formed on the adhesion layer. A direct reaction of Ti and $WF_6$ will form a solid substrate which will exhibit a volume expansion and become a cause of peeling-off of a layer.

When an adhesion layer for forming a W film is formed by sputtering, the substrate is often fixed on a mount using a holder or hooks. At portions under these hooks, an $SiO_2$ film which is an inter-layer insulating layer is exposed because almost no film is formed under the hooks by sputtering. When a W film grows on the exposed $SiO_2$, the W film is easily peeled off because of weak adhesion anti particles are produced.

To prevent a growth of W film on the exposed $SiO_2$ film, the exposed $SiO_2$ film around the substrate is covered with a ring for preventing reaction gas from reaching the exposed film of $SiO_2$.

In the prior art method of forming a W film described above, when a gas of $SiH_4$ or $SiH_2Cl_2$ is allowed to flow on a surface of a substrate for forming thereon a thin film of silicon, it is not supplied on the portion covered by a ring for preventing penetration of reaction gas. Thus, a layer of $SiO_2$ is exposed on a periphery of the substrate.

In the next process of forming WSi film by providing a flow of $WF_6$ gas, $WF_6$ may penetrate into a portion where $SiO_2$ film is exposed on a periphery of the substrate. In this case, a W film grows directly on the $SiO_2$ film, and results in a production of particles.

SUMMARY OF THE INVENTION

An object of the present invention is to prevent growth of W film on a portion off exposed $SiO_2$ film on the periphery of a substrate, and to prevent a production of particles caused by peeling-off of W film.

According to one aspect of the present invention, there is provided an apparatus For manufacturing a semiconductor device comprising a reactor the inside of which is evacuatable, a gas inlet means for introducing a reaction gas into the reactor, mount means for mounting an object substrate to be treated, penetration-preventing means for preventing penetration of gas, disposed to cover a peripheral portion of a surface of the object substrate to be treated and having an inner diameter smaller than a diameter off the object substrate and an outer perimeter larger than that of the object substrate, and another gas inlet means for introducing a gas to a space on the periphery of the object substrate covered by the penetration-preventing means.

According to another aspect of the present invention, there is provided a method of manufacturing a semiconductor device comprising the steps of mounting on a mount a semiconductor substrate having at least a surface portion covered with an adhesion layer for improving adhesion with tungsten and a surface portion not covered with the adhesion layer, partitioning a space on the surface of the semiconductor substrate spatially by partitioning member into a space on a first region including a substrate surface to be formed with a tungsten layer and a space on a second region including at least all of the substrate surface not formed with the adhesion layer, forming a thin film of silicon on the first and second region by introducing a silane based gas to the space on the first and second regions from respective gas ejecting holes, forming a tungsten silicide film by tungsten-silicidizing the thin film of silicon on the first region with a gas supplied to the space on the first region and further depositing tungsten silicide, and depositing a tungsten film on nuclei of the tungsten silicide.

By providing another gas ejecting hole in the vicinity of a surface which is poor in adhesion with tungsten and by supplying a source gas of silane, etc. From the gas ejecting hole, a silicon layer is Formed securely on such part which was conventionally poor in adhesion. Even though a small amount of reaction gas penetrates into a space on a surface not having an adhesion layer and being difficult to be covered with a silicon film by the silane gas supplied to the first region, through a penetration-preventing ring, tungsten silicide is formed before a tungsten film is formed, because a thin layer of silicon has already been formed also on such a surface by silane gas supplied to the second region that is under the ring for preventing penetration.

Thereby, it can be prevented that a tungsten film is grown directly on a part of poor adhesion. Consequently, problems of the prior art technique that a frequent peeling-off of tungsten film is caused and that a probability of producing particles is high can be solved.

In this way, production of particles is prevented in forming a W layer on a surface of a substrate which has an exposed surface of $SiO_2$ at a part thereof.

DESCRIPTION OF THE PREFERRED EMBODIMENTS

An embodiment according to the present invention will be described referring to FIGS. 1A and 1B.

Figure 1A:
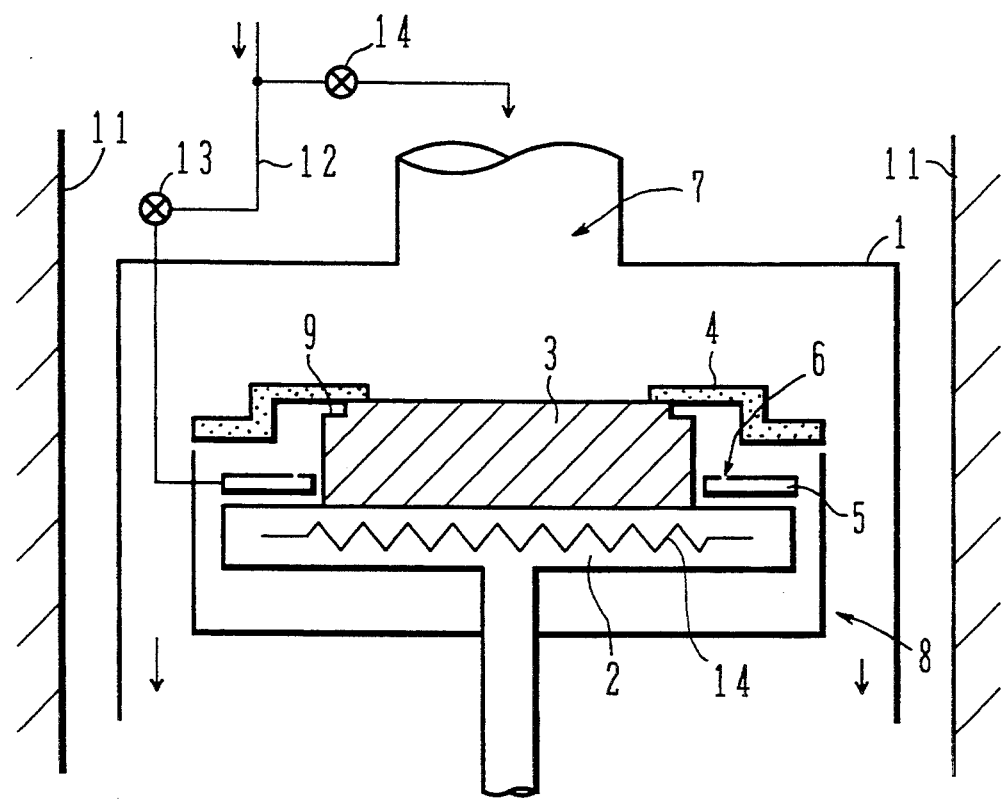
FIGS. 1A and 1B are schematic sectional diagrams showing a reduced pressure chemical vapor deposition (CVD) apparatus according to an embodiment of the present invention.

FIG. 1A shows a schematic sectional diagram of a vapor growth apparatus according to an embodiment of the present invention. On an upper part of a reactor 1, a gas inlet 7 for introducing a reaction gas is provided. At a position within the reactor 1 facing to the gas inlet 7, a susceptor 2 for mounting a substrate is provided. Lower part of the reactor 1 is connected to an evacuation system and is provided with an outlet 8 for exhausting reaction gas, reaction product gas or the like.

Within the reactor 1, a penetration-preventing ring 4 having a slightly smaller inner diameter than the diameter of a substrate 3 is disposed. In depositing a layer, the penetration-preventing ring 4 contacts with the periphery of a surface of the substrate 3 to thereby prevent a supply of a reaction gas to a space on the periphery of the substrate 3 with an $SiO_2$ surface 9. The ring 4 is formed, for example, of ceramics.

At a space around the substrate 3 under the penetration-preventing ring 4, a hollow gas supply ring 5 having an inner gas passage is disposed so as to encircle the substrate concentrically. A reaction gas is supplied to a gas supply ring 5 from a gas supply means 12. On a side wall of the gas supply ring 5, a plurality of gas ejecting holes for ejecting supplied reaction gas to external space is provided along the circumference. The ring 5 is formed, for example, of ceramics. The reactor 1 is encircled by a resistance heater 11. Such method as lamp heating may be used instead of resistance heating.

Hereunder, an embodiment of a method of depositing a W film utilizing a vapor growth apparatus shown in FIG. 1A.

A substrate 3 is mounted on a susceptor 2. On a surface of the substrate 3, an adhesion layer for improving adhesion with the W film is formed. For example, a laminated film of Ti film and TiN film is formed by sputtering. There are left traces of hooks which fixed or hold the substrate 3 at peripheries thereof in forming an adhesion layer by sputtering on the substrate 3. An $SiO_2$ surface 9 is exposed at each of the traces. A penetration-preventing ring 4 is provided to contact the periphery of the substrate to cover the $SiO_2$ surface 9.

Pressure inside the reactor is reduced to 1 Torr. The substrate 3 is heated to 450° C. A gas flow of $SiH_4$ is provided via a valve 14 from a gas inlet 7 with a flow rate of 30 sccm and a thin film of silicon of 2 to 3 nm is formed on the surface the substrate 3. At the same time, a gas flow of $SiH_4$ is provided via a valve 13 from a gas supply ring 5 with a flow rate of 80 sccm. By the $SiH_4$ gas supplied From the gas supply ring 5, a thin film of silicon of 2 to 3 nm is deposited also on the $SiO_2$ surface 9.

Closing, then, the valve 13, gas flows of $SiH_4$, with a flow rate of 5 seem, $WF_6$ with a flow rate of 10 sccm, and Ar with a flow rate of 1000 sccm are provided from the gas inlet 7 via the valve 14. The thin film of silicon is converted to tungsten silicide (WSi), and a WSi film is deposited thereon. Here, since the periphery of the surface of the substrate 3 is covered with the penetration-preventing ring 4, almost no reaction gas is supplied on the $SiO_2$ surface. Even though a small amount of reaction gas penetrates, a W film never grows on the $SiO_2$ surface 9, since the $SiO_2$ surface 9 has already been covered with a thin film of silicon formed thereon and hence a WSi film is formed first.

Stopping a gas supply of $SiH_4$, flows of $WF_6$ and $H_2$ are provided from the gas inlet 7. $WF_6$ is reduced by hydrogen and a film of W is deposited on nuclei of WSi film.

Thus, by forming a thin film of silicon on the surface of $SiO_2$ at the periphery of the surface of the substrate before forming a WSi layer, growth of W layer directly on the $SiO_2$ surface can be prevented. Consequently, production of particles caused by peeling-off of W film can be prevented.

In the above embodiment, description is given for a case using $SiH_4$ for forming a thin Si film. $SiH_2Cl_2$ also may be used. In forming a thin film of silicon, a penetration-preventing ring 4 and a substrate may not be contacted and may be kept separate. However, in supplying a flow of $WF_6$, the penetration-preventing ring 4 and the substrate may be preferably contacted for preventing penetration of $WF_6$ into a space on the $SiO_2$ surface 9.

Figure 1B:
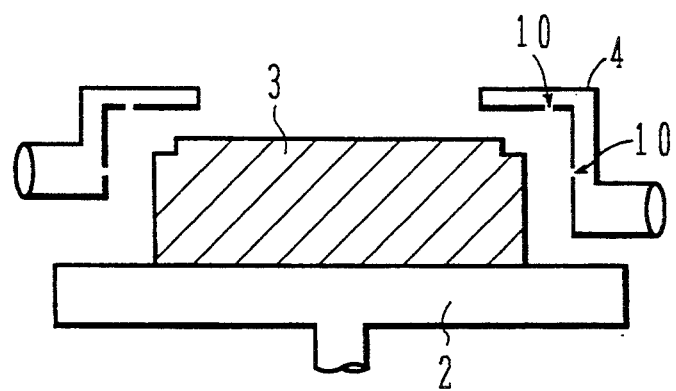

FIG. 1B shows a schematic sectional diagram of substrate mount part of a vapor growth apparatus according to a modification of the embodiment of the present invention.

The modified embodiment differs from the embodiment of FIG. 1A in that a penetration-preventing ring 4 is provided with a cavity inside, and that gas ejecting holes are provided on a side surface and on a bottom surface facing a substrate 3. Gas ejecting holes may be provided on either of the side or the bottom. A gas supply ring 5 is not necessary since a gas is ejected from the penetration-preventing ring 4. In other aspects, this modification has similar configuration as the vapor growth apparatus shown in FIG. 1A.

Reaction gases can be provided from a gas supply means similar to one shown in FIG. 1 into a penetration-preventing ring 4. Reaction gas provided to the inside of the penetration-preventing ring 4 is ejected to a space on the periphery of the substrate 3 from gas ejecting holes 10. By providing a gas supply function to the penetration-preventing ring 4, similar effects as those in the case shown in FIG. 1A can be obtained without providing an exclusive gas supply ring.

Figure 2:
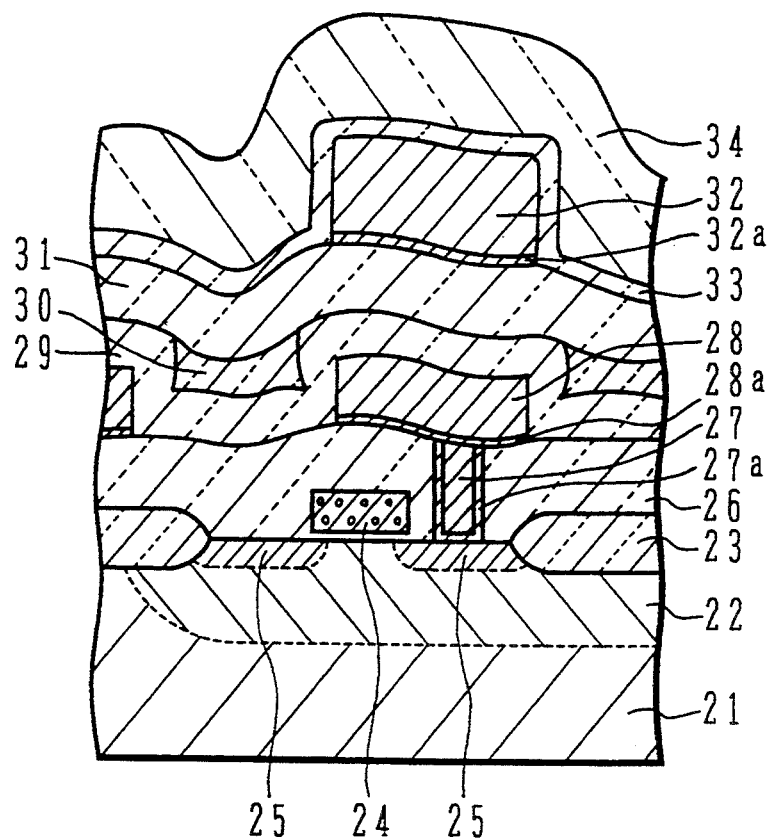
FIG. 2 is a sectional view of a semiconductor device manufactured by using a reduced pressure CVD apparatus according to an embodiment of the present invention.

FIG. 2 shows a semiconductor device manufactured according to an embodiment of the present invention. A method of manufacturing a semiconductor device as shown in FIG. 2 will be described hereunder.

On a surface of an n-type silicon substrate 21, a field oxide film 23 is formed and an active region is defined thereby. A p-type well 22 is formed in the active region. An n-channel MOSFET comprising an $n^+$-type regions 25 serving as source and drain regions and a gate electrode having an insulated gate structure is formed within the p-type well 22.

An interlayer insulating film 26 is formed on the active region and the field oxide film 23. The interlayer insulating film 26 is formed by depositing an oxide film based on tetraethoxy-orthosilane (TEOS) with a thickness of 1.0 μm, and then planarizing the surface by etch back.

A contact hole is formed in a portion of the interlayer insulating film 26 corresponding to the $n^+$-type region 25. A laminate film 27a formed of a contact metal layer comprising a Ti film with a thickness of 20 nm and an adhesion layer comprising a TiN film with a thickness or 80 nm is formed by sputtering on the surface of the interlayer insulating film 26.

A blanket W film is deposited by a reduced pressure chemical vapor deposition (CVD) apparatus of single wafer processing type. A thickness of the blanket W film is set to be approximately equal to a diameter of the contact hole. The blanket W film and adhesion layer except inside of the contact hole is removed by etch back with a fluorine based gas as $SF_6$ and an inert gas. Thus, W film 27 fills inside the contact hole.

A laminated film 28a formed of a contact metal layer comprising a Ti film with a thickness of 20 nm and an adhesion layer comprising a TiN film with a thickness of 80 nm, and an Al-Si-Cu film with a thickness of 600 nm are formed by sputtering. The laminated film 28a and the Al-Si-Cu film 28 are patterned to form a lower level wiring. Thus, the n+-type region 25 and the lower level wiring can be connected electrically.

An $SiO_2$ film 29 with a thickness of 400 nm is deposited by plasma CVD. By coating a spin-on-glass (SOG) film with a thickness of 250 nm and etching the film back, a planarization of surface is performed. A TEOS based oxide film 31 with a thickness of 600 nm is formed.

In the TEOS based oxide film 31 and the $SiO_2$ film 29, a contact hole to connect with the Al-Si-Cu film not shown in the figure is formed. The contact hole is filled with a contact metal layer, an adhesion layer and a W film formed by using the reduced pressure CVD apparatus of single wafer processing type.

A laminate 32a of a contact layer comprising a Ti film with a thickness of 20 nm and an adhesion layer comprising a TiN film with a thickness of 80 nm, and a Al-Si-Cu film 32 with a thickness of 1 $\mu$m are formed by sputtering. The laminate 32a and the Al-Si-Cu film 32 are patterned to form an upper level wiring. Thus, the lower level wiring and the upper level wiring can be connected electrically.

As a passivation film, an $SiO_2$ film 33 with a thickness of 200 nm and an SiN film 34 with a thickness of 1 $\mu$m are formed by plasma enhanced CVD.

Thus, an electrical connection between a diffusion region and a wiring layer and between respective wiring layers of a multiple wiring which are formed on a surface of a semiconductor substrate can be provided.

The present invention has been described above in relation to preferred embodiments. The present invention is not limited to what has been described in embodiments. It will be apparent to those skilled in the art that various changes, substitutions, combinations and improvements can be made within the scope and spirit of the appended claims.

I claim:

1. A method of manufacturing a semiconductor device comprising the steps of:
   mounting on a mount a semiconductor substrate having at least a surface portion covered with an adhesion layer for improving adhesion with tungsten and a surface portion not covered with the adhesion layer;
   partitioning a space on a surface of said semiconductor substrate spatially by partitioning member into a space on a first region including a substrate surface to be formed with a tungsten film and a space on a second region including at least all of the substrate surface not formed with said adhesion layer;
   forming a thin film of silicon on said first and second regions by introducing a silane based gas to said space of the first and second regions from respective gas ejecting holes;
   forming a tungsten silicide film by tungsten-silicidizing said thin film of silicon on said first region with a gas supplied to said space on said first region and further depositing tungsten silicide; and
   depositing a tungsten film on nuclei of said tungsten silicide.

2. A method of manufacturing a semiconductor device according to claim 1, wherein said silane based gas is silane or dichlorosilane.

3. A method of manufacturing a semiconductor device according to claim 1, wherein said adhesion layer comprises a titanium film and a film disposed on said titanium film and formed of materials of at least one species selected from a group consisting of titanium nitride, titanium tungstenide, and tungsten silicide.

* * * * *